United States Patent
Abramsky et al.

[11] Patent Number: 6,052,566
[45] Date of Patent: Apr. 18, 2000

[54] COMBINED RSSI/SNR-DRIVEN INTERMODULATION-MITIGATION SCHEME FOR CDMA TERMINALS

[75] Inventors: Victor Alexander Abramsky, Edison; Krishna Balachandran, Middletown; Kirk Kuokuang Chang; Kiran M. Rege, both of Marlboro, all of N.J.

[73] Assignee: Lucent Technologies Inc., Murray Hill, N.J.

[21] Appl. No.: 09/105,506

[22] Filed: Jun. 26, 1998

[51] Int. Cl.[7] .............................. H04B 1/10; H04B 15/00
[52] U.S. Cl. ..................... 455/67.1; 455/295; 455/67.3; 455/311; 455/296; 455/343; 455/249.1; 455/251.1
[58] Field of Search ............................ 455/67.1, 67.3, 455/249.1, 251.1, 295, 296, 302, 311, 245.2, 248.1, 254, 268, 343; 330/86, 96, 97, 129, 278, 279

[56] References Cited

U.S. PATENT DOCUMENTS

| | | | |
|---|---|---|---|
| 3,619,786 | 11/1971 | Wilcox | 333/81 |
| 4,553,105 | 11/1985 | Sasaki | 330/145 |
| 4,665,560 | 5/1987 | Lange | 455/249 |
| 4,893,349 | 1/1990 | Eastmond et al. | 455/212 |
| 5,321,849 | 6/1994 | Lemson | 455/67.1 |
| 5,564,094 | 10/1996 | Anderson et al. | 455/295 |
| 5,697,081 | 12/1997 | Lyall, Jr. et al. | 455/249.1 |
| 5,809,400 | 9/1998 | Abramsky et al. | 455/67.3 |
| 5,907,798 | 5/1999 | Abramsky et al. | 455/249.1 |
| 5,909,645 | 6/1999 | Abramsky et al. | 455/249.1 |

Primary Examiner—Donnie L. Crosland
Attorney, Agent, or Firm—Joseph J. Opalach

[57] ABSTRACT

A wireless receiver includes a variable attenuator, a signal-to-noise ratio (SNR estimator), and a received signal strength indicator (RSSI) level detector. The RSSI level of the received signal is used as a primary criterion on setting the attenuator status. Once the attenuator is set based upon the RSSI readings, an SNR check is made to determine the possible presence of IM. Then, further adjustment on the attenuator status is made according to the SNR check.

15 Claims, 4 Drawing Sheets

COMBINED RSSI/SNR-DRIVEN INTERMODULATION-MITIGATION SCHEME FOR CDMA TERMINALS

CROSS-REFERENCE TO RELATED APPLICATIONS

Related subject matter is disclosed in the commonly assigned, U.S. Patent applications of: Abramsky et al., entitled "Wireless Telephone Intermodulation Performance Enhancement Techniques," Ser. No. 08/668,268, filed on Jun. 21, 1996; Abramsky et al., U.S. Pat. No. 5,907,798 entitled "Intermodulation Performance Enhancement By Dynamically Controlling RF Amplifier Current," Ser. No. 08/668,152, filed on Jun. 21, 1996; now U.S. Pat. No. 5,809,400 and Abramsky et al., entitled "Receiver With Dynamic Attenuation Control For Adaptive Intermodulation Performance Enhancement," Ser. No. 08/668,271, filed on Jun. 21, 1996 now U.S. Pat. No. 5,909,645.

FIELD OF THE INVENTION

This invention relates generally to communications and, more particularly, to wireless systems.

BACKGROUND OF THE INVENTION

It is well-known that CDMA (code division multiple access) wireless systems are vulnerable to out-of-band interference due to the wide-band nature of CDMA. This problem is manifested even further by the fact that in the current dual-mode CDMA deployment, many CDMA base-stations co-exist with other narrow-band base-stations, e.g., AMPS (Advanced Mobile Phone Service) base stations. It has been observed in the field that without a properly designed intermodulation-mitigation device, a CDMA call will likely be dropped when the associated mobile terminal drives by an AMPS base-station. This is caused by the fact that for strong, e.g., high power, out-of-band interference from the AMPS base-station, receiver equipment non-linearities generate a significant in-band intermodulation (IM) tone when processing the received signal. This IM tone severely degrades frame error rate (FER) performance and, hence, the call is dropped.

A variety of IM-mitigation schemes have been proposed for use in wireless equipment. All of these approaches utilize a variable attenuator in the wireless receiver. The variable attenuator reduces the received signal level before processing by the receiver equipment to reduce, if not eliminate, the aforementioned equipment induced non-linearities. It should be noted that the variable attenuator itself introduces some level of device noise into the receiver, but this level of noise is tolerable when attempting to combat IM distortion of the received signal. As such, there is a trade-off between eliminating IM distortion and introducing device noise.

One IM-mitigation scheme is to use the RSSI (Received Signal Strength Indicator) within a wireless receiver for setting the variable attenuator. In this RSSI-only approach, the attenuation level is set as a direct function of the RSSI value so that, e.g., the higher the RSSI value, the more the attenuator reduces the received signal level. Simulation results show that this RSSI-based scheme provides acceptable performance across a wide range of cellular environments by providing a good trade-off between in-band IM power and receiver device noise.

Another IM-mitigation method is illustrated in the above-mentioned, co-pending, commonly assigned U.S. Patent applications. In this IM-mitigation method only the received signal-to-noise ratio (SNR) is used to adjust the attenuator. However, it should be noted that it is very hard to get good SNR measurements and any subsequent measure of SNR has a level of variance that causes problems. As such, this approach may result in unnecessary adjustments to the attenuator, thus, perhaps, increasing the above-mentioned attenuator noise even when no IM interference is present. This may also cause the system to oscillate.

Another IM-mitigation approach that uses primary SNR and secondary RSSI criteria is illustrated by U.S. Pat. No. 5,564,094. Generally speaking, this approach utilizes the ability to decode the received signal and the RSSI. If the received signal can be decoded, no corrective actions are taken. However, if the received signal cannot be decoded, a check is made of the RSSI level. If the RSSI level is above a certain value, the received signal is attenuated as a function of the RSSI value. Otherwise, no corrective action is taken. This approach presumes that once the received signal can not be decoded, any RSSI above a certain level indicates the presence of IM interference. Unfortunately, undecodable signal errors occur even in a good cellular environment. As such, this method also may cause unnecessary attenuation of the received signal.

SUMMARY OF THE INVENTION

We have developed a different IM-mitigation approach that obtains improved performance. In particular, and in accordance with the invention, an IM-mitigation approach uses the RSSI as the primary criteria and the SNR as a secondary criteria in setting the attenuation level of a received signal. As a result, the chances of turning on the attenuator unnecessarily are reduced, if not, avoided.

In an embodiment of the invention, a wireless receiver includes a variable attenuator, an SNR estimator, and a RSSI level detector. An attenuation level is first chosen based only on the RSSI value. Then an SNR measurement is taken for detecting the possible presence of IM interference. Based on this SNR measurement, adjustments on the attenuation level are made.

Our approach recognizes the fact that the power of IM is a combined result of system non-linearity and the out-of-band interference. When the RSSI value is high, the system is more tolerable to device noise. As a result, the attenuator is turned on to protect the system from potential high power IM. However, if at the same time the interference power is low, (e.g., when the mobile is close to the connecting base-station) kicking in the attenuation will degrade the performance.

DETAILED DESCRIPTION

Before describing the inventive concept, a short description of the above-mentioned prior art RSSI-only IM mitigation technique is provided as further background. (Information on the other two mentioned IM-mitigation techniques, i.e., the SNR approach and the FEC/RSSI approach, are provided in the above-mentioned U.S. Patent applications of Abramsky et al; and U.S. Pat. No. 5,564,094, respectively.) After the description of the RSSI approach, the inventive concept is presented.

RSSI-only IM Mitigation Technique

Figure 1:
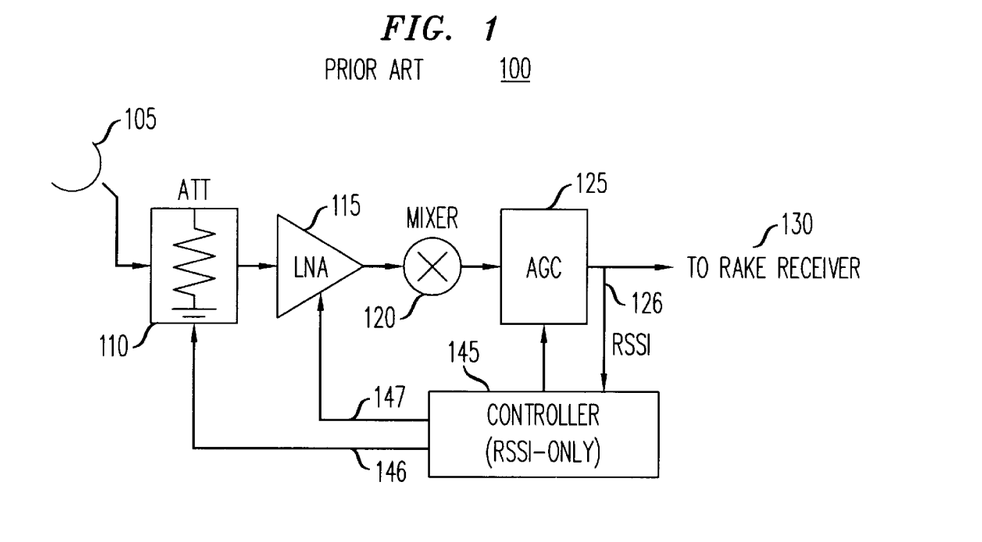
FIG. 1 shows a portion of a prior art CDMA terminal.

A block diagram of a portion of a typical prior art CDMA terminal 100 is depicted in FIG. 1. The elements shown in FIG. 1 are well-known and will not be described in detail. CDMA terminal portion 100 comprises antenna 105, variable attenuator (ATT) 110, low noise amplifier (LNA) 115, mixer 120, Automatic Gain Control (AGC) 125, and controller 145.

Antenna 105 receives a CDMA signal and provides a received signal to ATT 110. In the RSSI-only approach, the amount of attenuation of the received signal is determined by the attenuation level of ATT 110 and the on-off status of LNA 115. Both ATT 110 and LNA 115 are controlled by controller 145 via signals 146 and 147, respectively. LNA 115 provides an output signal to mixer 120, which provides an output signal to AGC 125. The latter compensates for the received signal attenuation (if any) performed by ATT 110 and LNA 115 and is also under the control of controller 145. (It should be noted that the attenuator can be placed in front of the LNA or behind the LNA, or both. It is more likely to be placed behind the LNA and before the mixer, since the mixer is more vulnerable to IM (exhibits a higher level of non-linearity).) AGC 125 ensures output signal 126 maintains a constant average input power level to a RAKE receiver (not shown). Output signal 126 is also used for the RSSI level associated with the received signal and is applied to controller 145, which performs the RSSI-only mitigation technique.

Figure 2:
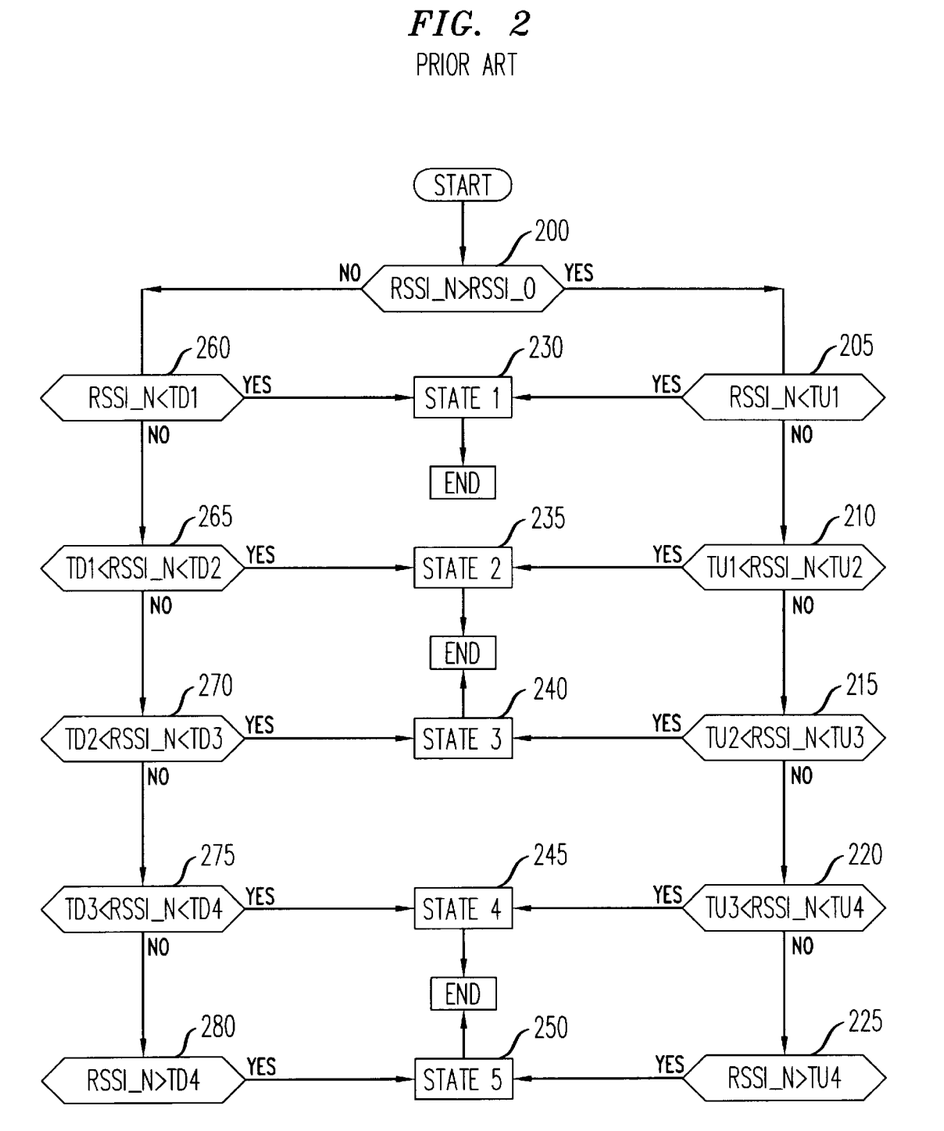
FIG. 2 shows a flow chart of a prior art RSSI-only IM mitigation technique.

A flow chart for the RSSI-only IM mitigation approach is shown in FIG. 2. As known in the art, RSSI is an estimate of the power of the received signal, R, which is a composite of the desired signal, S, and a noise signal, N, i.e., $$R=S+N.$$

As shown in FIG. 2, the RSSI-only technique adjusts attenuation of the received signal by comparing the RSSI level with a set of threshold values. In FIG. 2, the following parameters are used:

RSSI_N=the RSSI value of the latest CDMA time slot;

RSSI_O=the RSSI value of the past CDMA time slot;

TD1, TD2, TD3, TD4: predefined threshold values;

and

TU1, TU2, TU3, TU4: predefined threshold values.

The method shown in FIG. 2 is repetitively performed for each CDMA time slot. In step 200, of FIG. 2, the new RSSI value, RSSI_N, is compared to the old RSSI value, RSSI_O. If the value of RSSI_N is greater than RSSI_O, then steps 205, 210, 215, 220, and 225, determine where the value of RSSI_N falls in the range of threshold values TU1, TU2, TU3, and TU4. Similarly, if the value of RSSI_N is not greater than RSSI_O, then steps 260, 265, 270, 275, and 280, determine where the value of RSSI_N falls in the range of threshold values TD1, TD2, TD3, and TD4. As can be observed from FIG. 2, depending on the value of RSSI_N, one of five states are entered, where each state has associated attenuator settings. (For the examples used herein, the term "attenuator settings" refers to the settings of both the attenuator and the low noise amplifier. However, the term "attenuator settings" can also include one element, e.g., just the attenuator, or additional elements, depending on the system design.) A definition of these states is shown in Table One, below.

TABLE ONE

| State | LNA Status | Attenuation Level (dB) |
|---|---|---|
| 1 | ON | −1 |
| 2 | ON | −7 |
| 3 | ON | −15 |
| 4 | OFF | −1 |
| 5 | OFF | −7 |

Table Two shows values for the aforementioned threshold values in dBm.

TABLE TWO

| parameter | dBm | parameter | dBm |
|---|---|---|---|
| TU1 | −94 | TD1 | −96 |
| TU2 | −89 | TD2 | −90 |
| TU3 | −85 | TD3 | −87 |
| TU4 | −77 | TD4 | −78 |

It should be noted that the two sets of threshold values provide hysteresis which prevents the system from oscillating between states.

Primary-RSSI/Secondary-SNR IM Mitigation Technique

The current RSSI-only scheme performs reasonably well and our goal is to further improve the system performance. As such, we have made the following observations with respect to performing IM mitigation.

Referring briefly to FIG. 1, AGC 125 provides a signal to the RAKE receiver (not shown). It can be assumed that this signal is equal to S+N, where S is the desired signal, and N is the noise. The noise, N, can expressed as:

$$N=N_{oc}+N_{ou}+N_d+N_i;$$

where $N_{oc}$: noise from other cells;

$N_{ou}$: noise from other user in the same cell;

$N_d$: device noise (including thermal noise); and $N_i$: in-band IM interference.

In general, the power level of $N_{oc}$ and $N_{ou}$, as well as S, will not be affected by changing the attenuator value of ATT 110 and the on-off status of LNA 115 since these signals are received from antenna 105 and AGC 125 compensates for any attenuation performed by ATT 110 and LNA 115. However, some observations can be made with respect to $N_d$ and $N_i$.

Figure 3:
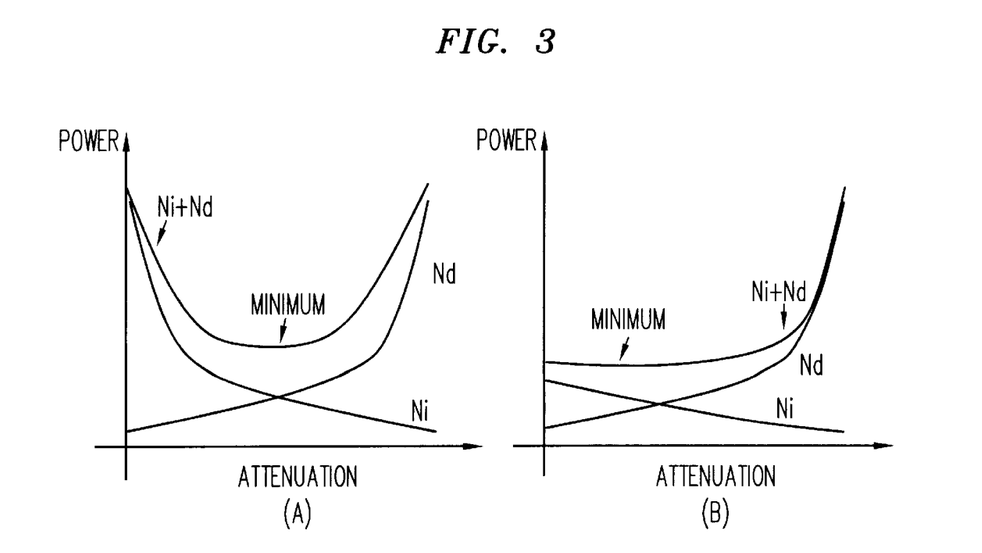
FIG. 3 shows two graphs illustrating the behavior of device noise and in-band interference.

Turning now to FIG. 3, two graphs (A) and (B) illustrate simplified views for the power of $N_d$ and $N_i$ as a function of the level of attenuation in two different cellular environments. Graph (A) is associated with a mobile station being relatively close to an interfering source, e.g., an AMPS base station. In graph (A), at zero, or low levels of attenuation, $N_i$ is relatively high (which indicates that the mobile is fairly close to the AMPS base-station). As attenuation levels are increased, the minimized $N_i+N_d$ occurs at a relatively high attenuation. In comparison, graph (B) is associated with being close to, e.g., a CDMA transmitter. In graph (B), at zero, or low levels of attenuation, $N_i$ is relatively low. As attenuation levels are increased, a smaller amount of attenuation achieve the minimization of $N_i+N_d$. As a result, it an be observed from graphs (A) and (B) that the optimal attenuation level (such that $N_i+N_d$ is minimized) varies as a function of the underlying cellular environment. As such, there is a need for an IM-mitigation technique that would be capable of providing the optimal attenuation level in different cellular environments.

Therefore we have developed a different IM-mitigation approach that obtains better performance when the out-of-band interferer power is low and RSSI is high. In particular, and in accordance with the invention, an IM-mitigation approach uses the RSSI as the primary criteria and the SNR as a secondary criteria in setting the attenuation level of a received signal. Our approach recognizes the fact that the power of IM is a combined result of system non-linearity and the out-of-band interference. When the RSSI value is high, the system is more tolerable to device noise. As a result, the attenuator is turned on to protect the system from potential high power IM. However, if at the same time the interference power is low, (e.g., when the mobile is close to the connecting base-station) kicking in the attenuation will degrade the performance.

Figure 4:
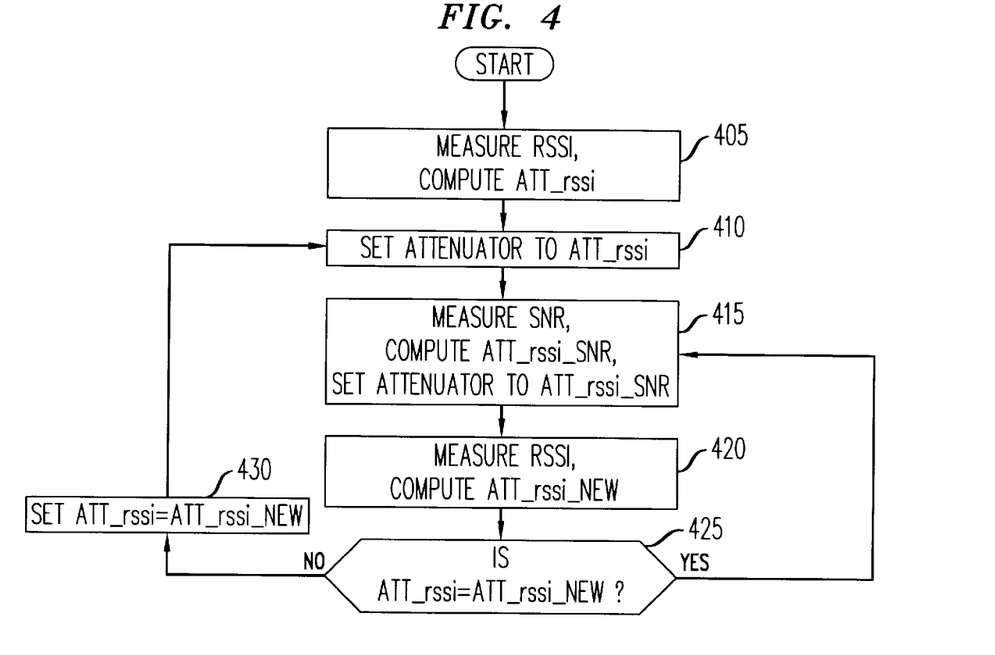
FIG. 4 shows a flow chart of an illustrative method in accordance with the principle of the invention.

Turning now to FIG. 4, an illustrative flow chart is shown of a method embodying the principles of the invention. First, the measured RSSI level is used as a primary criterion in setting the attenuation level. As such, in step 405, a measurement is made of the RSSI level associated with a received CDMA signal and a corresponding attenuator state, ATT_rssi, is computed for setting the attenuator and the low noise amplifier. The attenuator state is illustratively computed using the above-described flow chart shown in FIG. 2 and Tables One and Two (shown above). In step 410, the attenuator settings are applied to, e.g., the attenuator and low noise amplifier.

At this point, the SNR is used as a secondary criteria in setting the attenuation level of a received signal. In step 415, a measurement is made of the resulting SNR associated with the received signal at these attenuator settings. Using this SNR value, a corresponding attenuator state, ATT_rssi_SNR, is computed (described further below) and these new attenuator settings are applied to, e.g., the attenuator and low noise amplifier. (In this step, the measured SNR is used as an indicator in detecting the possible presence of high IM interference. As such, attenuation adjustments, if any, are made as a function of the measured SNR.)

In step 420, another measurement is made of the RSSI level associated with the received CDMA signal and a corresponding attenuator state, ATT_rssi_new, is computed. If, in step 425, the value of ATT_rssi is equal to ATT_rssi_new, then execution proceeds back to step 415. (In other words, the primary indicator—the RSSI value—has not significantly changed and the method continues to use SNR to vary attenuator settings.) However, if, in step 425, these values are not equal, execution proceeds back to step 410, through step 430, in which ATT_rssi is set equal to ATT_rssi_new. (In this latter case, the primary indicator—the RSSI value—has changed enough to warrant re-starting the process with new baseline attenuator settings.)

Figure 5:
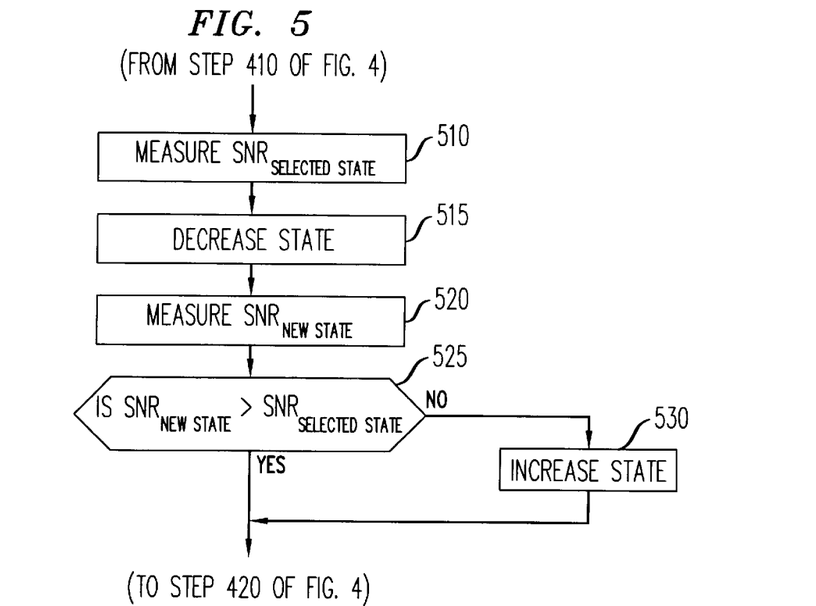
FIG. 5 shows a flow chart of an illustrative method in accordance with the principle of the invention for use in the method of FIG. 4.

As described above, in step 405, of FIG. 4, a state is selected as a function of the RSSI associated with the received CDMA signal. This state is used, so-to-speak, as a baseline for the attenuator settings in step 410. Turning now to FIG. 5, an illustrative flow chart is shown for varying the attenuator settings as a function of SNR for use in step 415 of FIG. 4. In this method, the above-described states and threshold values of Tables One and Two are used. In step 510, a measurement is made of the SNR associated with the received CDMA signal for the selected state. (It should be noted that a predetermined period of time, T, should be allowed to pass to allow the system to settle in the selected state before measuring the SNR. An illustrative value of T is the time to receive 20 CDMA frames, where each frame is 20 milli-seconds.) In step 515, the state is changed to the next lower state (e.g., if in state 4 go to state 3). In other words, the system is "perturbed" by forcing the state to decrease by 1. In step 520, another measurement is made of the SNR of the received CDMA signal for the new state. (Again, a period of time, T, should pass to allow the system to settle in the new state.) In step 525, if this second measured SNR is greater than the SNR of the state selected in step 510, execution continues to step 420, of FIG. 4, with the system remaining in the new state. (In this instance, the decrease in attenuation state did not adversely impact the SNR of the received CDMA signal, e.g., the IM interference is not dominating the received CDMA signal). However, if the second measured SNR is not greater than the SNR of the selected state, then step 530 changes the state back to the state previously selected in step 505 and execution continues to step 420, of FIG. 4.

As can be observed from FIGS. 4 and 5, first the RSSI level associated with the received signal is used to select an attenuation state for the system. The system is then perturbed by changing to a new attenuation state, where the SNR is used to further modify the attenuation level. Also, it should be noted that although FIGS. 4 and 5 are representative of illustrative flow charts embodying the principles of the invention, the implementation of these flow charts can be performed in a number of ways. For example, steps 405 and 420 can be performed every T1 seconds, e.g., by setting an interrupt timer; while steps 510, 515, 520, 525, and 530, can be repetitively performed every T2 seconds, where T2<T1. Illustratively, 1/T2 represents the frequency of perturbation of the system. There is trade-off in how frequently this perturbation of the system (as represented by step 415 of FIG. 4) should be executed. For low IM power, more perturbation of the system provides better performance. Conversely, for high IM power, less perturbation of the system provides better performance.

Figure 6:
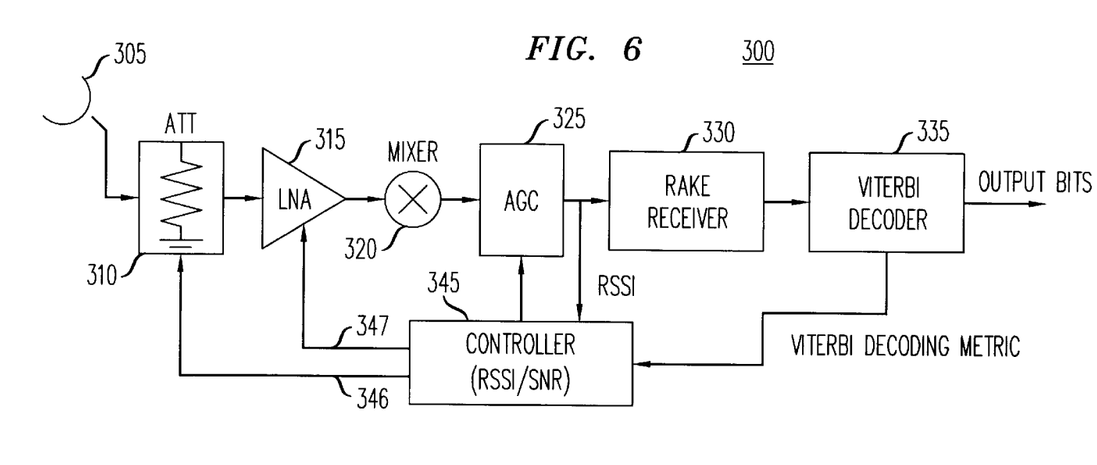
FIG. 6 shows a portion of a mobile terminal embodying the principles of the invention.

An illustrative block diagram of a portion of a CDMA terminal 300 in accordance with the principles of the invention is shown in FIG. 6. Other than the inventive concept, the elements shown in FIG. 6 are well-known and will not be described in detail. CDMA terminal portion 300 comprises antenna 305, variable attenuator (ATT) 310, low noise amplifier (LNA) 315, mixer 320, Automatic Gain Control (AGC) 325, RAKE receiver 330, Viterbi Decoder 335, and controller 345.

Antenna 305 receives a CDMA signal and provides a received signal to ATT 310. In accordance with the principles of the invention, controller 345 controls the amount of attenuation of the received signal using, e.g., the methods shown in FIGS. 4 and 5, for setting the level of attenuation of ATT 310 and the on-off status of LNA 315. LNA 315 provides an output signal to mixer 320, which provides an output signal to AGC 325. The latter compensates for the received signal attenuation (if any) performed by ATT 310 and LNA 315 and is also under the control of controller 345. AGC 325 ensures output signal 326 maintains a constant average input power level to a RAKE receiver 330. Output signal 326 is also used for the RSSI level associated with the received signal and is applied to controller 345. RAKE receiver 330 provides an output symbol stream to Viterbi decoder 335, which provides a recovered stream of output bits. In accordance with a feature of the invention, for every frame, controller 345 uses a Viterbi decoding metric as an estimate of the SNR associated with the received signal. (As known in the art, a Viterbi decoding metric is available for every frame as a part of the function of Viterbi decoder 335.) As described further below, the use of a Viterbi decoding metric as an estimate of SNR has some advantages over other approaches to estimate SNR (described below). Since there is some variance to the Viterbi decoding metric, controller 345 performs a simple IIR filtering of the Viterbi decoding metric, e.g.:

$$Y_n = (1-\alpha)Y_{n-1} + (X),$$

where X represents the Viterbi decoding metric for each frame, $Y_n$ and $Y_{n-1}$ are the current and previous filter output values, respectively; and $\alpha$ is a suitable constant, e.g., $\alpha$ equal to 0.2. A reliable SNR indicator can be obtained over 3 to 5 CDMA frames.

Figure 7:
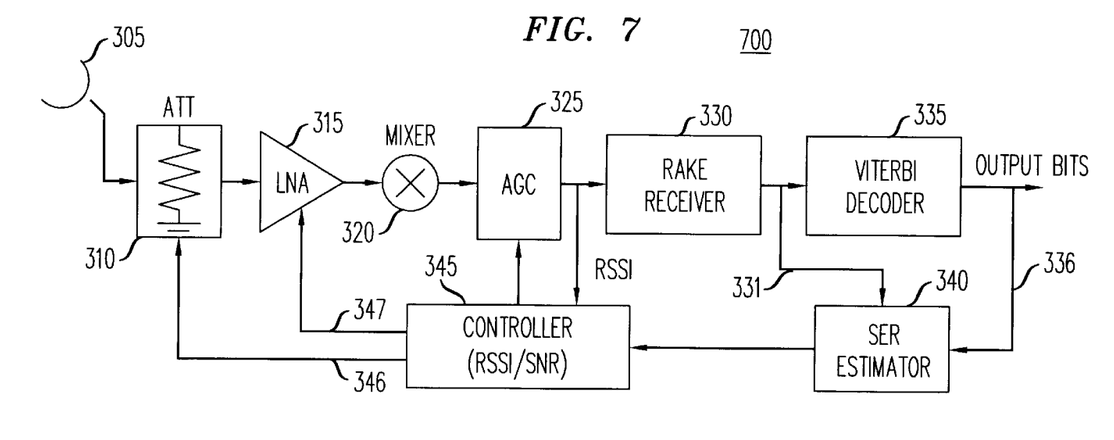
FIG. 7 shows another embodiment of a portion of a mobile terminal embodying the principles of the invention.

Another illustrative block diagram of a portion of a CDMA terminal 700 in accordance with the principles of the invention is shown in FIG. 7. CDMA terminal portion 700 is similar to that shown in FIG. 6, except that controller 345 uses symbol error rate (SER) estimator 340 as an estimate of the SNR. After every frame of the received CDMA signal, SER estimator 340 develops a symbol error count for use as a measure of SNR. The number of symbol errors can be determined for every frame by re-encoding the decoded bits (represented by signal 336) and comparing the resultant symbols with the received symbols (represented by signal 331). (Additional information on the use of SER as an indicator of SNR can be found in the above-mentioned, commonly assigned, co-pending U.S. Patent Applications of Abramsky et al., and in the commonly assigned U.S. Patent Application of Carl Weaver and Wei Peng, entitled "Symbol Error Based Power Control For Mobile Telecommunication System," Ser. No. 08/346,800, filed Nov. 30, 1994.) Some drawbacks to the use of SER as an estimate of SNR are that the SER can be obtained only when a frame does not have unrecoverable errors. This is in contrast to the above-described use of a Viterbi decoding metric as an estimate of SNR. The Viterbi decoding metric is always available even in the presence of unrecoverable frame errors. In addition, simulation results indicate that the variance of the Viterbi decoding metric is smaller than the variance of the SER.

A more detailed version of the above-described method embodying the principles of the invention is described below. This illustrative method is biased towards higher front end gain than is optimal for meeting IS-98A IM requirements. The Symbol Error Rate (SER) indicator is used to determine whether higher front end gain improves performance. First, the following terms are defined:

FrontGain—This is the gain of the receiver front end which includes the gain of LNA and any attenuators before or after the LNA (e.g., ATT 310 and LNA 315 of FIG. 5). FrontGain is assumed to have up to five states (e.g.,five stale One, above), although equipment may have less, or more, than five states. The highest gain (lowest attenuation) state is labeled state 1, state 2 is the next lower gain, state 3 is lower gain than state 2 and so on.

RSSI—This is the measured total power of Signal+Noise+Interference at the antenna interface.

SER_f—Symbol Error Rate filtered by an IIR filter. This is used to make a decision on changes to FrontGain.

SERi—Symbol Error Rate for the i-th frame, where i indicates the latest frame, i−1 is the frame before the latest frame.

SER_AV$_i$—The latest (i-th) SER averaged over the latest M2 frames (defined below). SER_AV$_{i-1}$ is the SER averaged over the previous M2 frames.

M1—The number of received CDMA frames over which the RSSI is averaged and compared to thresholds to make a decision on the FrontGain state. Illustratively, M1=2.

M2—The number of received CDMA frames over which SER is averaged before being fed into an IIR filter. Illustratively, M2=2.

M3—The number of consecutive received CDMA frames that FrontGain must remain in the same state n before the state is changed to state n−1 for a perturbation part of the algorithm. Illustratively, M3=6.

M4—The maximum number of consecutive received CDMA frames that FrontGain may remain in a perturbed (not RSSI based state) before either further perturbation to n−2 state or return to RSSI based state n. Illustratively, M4=20.

k1—The IIR filter constant which multiplies the most recent averaged SER.

k2—The IIR filter constant which multiplies the previous output of IIR filter.

It should be noted that the RSSI-based portion of the method shown below is executed without changes as if SER had no effect. However, if RSSI remains constant enough that the FrontGain state had not changed over the last few frames, then FrontGain is changed towards the higher gain (less attenuation) and the SER is used to determine whether to remain in this higher gain state for some limited time or go back to the RSSI based state. Up to two state changes (perturbations) towards higher FrontGain are allowed for a limited time before returning to the original RSSI based state and starting the process over again. If the RSSI crosses the threshold indicating that the RSSI based state is changed, the FrontGain is set to a new RSSI based state, since RSSI has priority over SER related changes. A high-level description of the steps of this illustrative method is as follows:

1. At power up set FrontGain to state 1 (max gain, lowest attenuation)

2. RSSI is averaged over M1 frames. Every M1 frames, the algorithm compares RSSI to the threshold in the RSSI look-up table and sets the FrontGain based on the thresholds in FrontGain look-up table.

3. SER is averaged over M2 frames to obtain: SER$_{av}$= (SER$_i$+SER$_{i-1}$)/2. New SERav is available every M2 frames and fed into an IIR filter to obtain: SER_f$_i$= k1*SER_AV$_i$+k2*SER_f$_{i-1}$. A new SER_f value is also available every M2 frames.

4. FrontGain state is adjusted every M1 frames as per step 2 regardless of SER. However, if FrontGain state had not changed for M3 consecutive frames, a "perturbation" is performed. Perturbation is the change in Front gain state from n to n−1, that is toward the higher gain (lower attenuation) and then comparing the SER_f in the n−1 state to that in n state in order to determine whether overruling RSSI based state was correct.

5. After the FrontGain was perturbed once (increased by one state relative to that based on RSSI), a comparison if made of the newly obtained SER_f with SER_f in the previous FrontGain state. If SER_f in the n−1 state is better, then continue in this state for a maximum of M4 frames. If at any time the SER_f value becomes worse than the last SER_f in state n, change FrontGain back to state n. If at any time the RSSI value indicates that the RSSI based state should be different from state n, change FrontGain to that state regardless of SER value. Note that even though due to perturbation the state was changed from n to n−1, the RSSI based decisions are still made as if the state is n as long as the RSSI based state is n. The SER based "perturbed" states are only allowed as long as RSSI does not cross the threshold into another state. As soon as the RSSI threshold is crossed, the Front Gain is adjusted solely based on the RSSI look-up table (e.g., Table One, above).

6. If after perturbation the SER became worse or RSSI changed enough to cross a threshold and trigger a new state, then repeat step 4 (wait until the state stays constant for M3 frames and then perturb). If after perturbation the SER continues to be better than in state n (n is RSSI based state), then after M4 frames change FrontGain to state n−2, that is two states higher gain (less attenuation) than RSSI based state n. If at any time while in state n−2, SER becomes worse than in state n−1, go to state n (not to state n−1). If SER in state n−2 stays better than in state n−1, remain in state n−2 for a maximum of M4 frames. Once the timer set for M4 frames had expired, return to state n (not n−1) and repeat step 4. If RSSI had crossed a threshold indicating that the RSSI based state is no longer n, then change FrontGain to new RSSI based state and repeat step 4.

As described above, a new RSSI/SNR combined intermodulation-mitigation scheme has been presented. Simulation results (not shown) have indicated performance improvements such that this new approach provides an excellent trade-off across a wide range of cellular environments.

The foregoing merely illustrates the principles of the invention and it will thus be appreciated that those skilled in the art will be able to devise numerous alternative arrangements which, although not explicitly described herein, embody the principles of the invention and are within its spirit and scope. For example, although the inventive concept was illustrated herein as being implemented with discrete functional building blocks, e.g., controller 345, etc., the functions of any one or more of those building blocks can be carried out using one or more appropriately programmed processors or processing circuitry, e.g., a digital signal processor; discrete circuit elements; integrated circuits; etc.

What is claimed:

1. A method for use in wireless equipment for processing a received signal, the method comprising the steps of:

(a) selecting one of a number of attenuation states as a function of a measured signal strength associated with the received signal, each attenuation state associated with a respective attenuation level of the received signal;

(b) in the selected attenuation state, measuring a signal to noise ratio (SNR) associated with the received signal;

(c) changing the attenuation state to a new attenuation state selected from one of the number of attenuation states;

(d) in the new attenuation state, measuring another SNR associated with the received signal; and (e) changing the attenuation state back to the selected attenuation state if the measured SNR in step (d) is not greater than the measured SNR in step (b).

2. The method of claim 1 wherein changing or selecting an attenuation state includes the steps of:

setting an attenuation level of a variable attenuator for attenuating the received signal; and turning on, or off, an amplifier for processing the received signal.

3. The method of claim 1 wherein step (a) is performed at least every T1 seconds, and steps (b) through (e) are performed at least every T2 seconds, where T2<T1.

4. The method of claim 1 wherein steps (b) or (d) include the step of using a Viterbi decoding metric for measuring the SNR.

5. The method of claim 1 wherein steps (b) or (d) include the step of using a symbol error rate estimate for measuring the SNR.

6. Apparatus for use in a receiver, the apparatus comprising:

an attenuator element for use in attenuating a received signal;

a signal-to-noise estimator for producing an estimate of a signal-to-noise ratio (SNR) associated with the received signal;

a received signal strength indicator (RSSI) for producing an RSSI signal associated with the received signal; and a controller for setting an attenuation level of the attenuator element by using the RSSI signal as a primary indicator and the SNR as a secondary indicator;

wherein the controller sets the attenuation level by performing a method, the method comprising the steps of:

(a) selecting one of a number of attenuation states as a function of the RSSI signal, each attenuation state associated with a respective attenuation level;

(b) in the selected attenuation state, storing a measure of the SNR;

(c) changing the attenuation state to a new attenuation state selected from one of the number of attenuation states;

(d) in the new attenuation state, storing another measure of the SNR; and (e) changing the attenuation state back to the selected attenuation state if the measured SNR in step (d) is not greater than the measured SNR in step (b).

7. The apparatus of claim 6 wherein the attenuator element comprises:

a variable attenuator having a range of attenuation levels that can be set by the controller; and an amplifier that can be turned on or turned off by the controller.

8. The apparatus of claim 6, wherein the controller performs step (a) is at least every T1 seconds, and performs steps (b) through (e) at least every T2 seconds, where T2<T1.

9. The apparatus of claim 6 wherein the signal-to-noise estimator is a Viterbi decoder and the estimate of the SNR is a signal representative of a Viterbi decoding metric.

10. The apparatus of claim 6 wherein the signal-to-noise estimator is a symbol error rate estimator and the estimate of the SNR is a signal representative of a symbol error rate.

11. Apparatus for use in a receiver, the apparatus comprising:

an attenuator element for use in attenuating a received signal; and processing circuitry that (a) determines an estimate of a signal-to-noise ratio (SNR) associated with the received signal, (b) determines a received signal strength indicator (RSSI) signal associated with the received signal; and (b) sets an attenuation level of the attenuator element by using the RSSI signal as a primary indicator and the SNR as a secondary indicator;

wherein the processing circuitry sets the attenuation level by performing a method, the method comprising the steps of:
(a) selecting one of a number of attenuation states as a function of the RSSI signal, each attenuation state associated with a respective attenuation level;
(b) in the selected attenuation state, storing a measure of the SNR;
(c) changing the attenuation state to a new attenuation state selected from one of the number of attenuation states;
(d) in the new attenuation state, storing another measure of the SNR; and
(e) changing the attenuation state back to the selected attenuation state if the measured SNR in step (d) is not greater than the measured SNR in step (b).

12. The apparatus of claim 11 wherein the attenuator element comprises:
a variable attenuator having a range of attenuation levels that can be set by the processing circuitry; and
an amplifier that can be turned on or turned off by the processing circuitry.

13. The apparatus of claim 11, wherein the processing circuitry performs step (a) is at least every T1 seconds, and performs steps (b) through (e) at least every T2 seconds, where T2<T1.

14. The apparatus of claim 11 wherein the processing circuitry determines the SNR by using a Viterbi decoding metric.

15. The apparatus of claim 11 wherein the processing circuitry determines the SNR by using a symbol error rate estimate.

* * * * *